United States Patent
Fukuda

(10) Patent No.: US 7,733,013 B2
(45) Date of Patent: Jun. 8, 2010

(54) DISPLAY APPARATUS

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 218 days.

(21) Appl. No.: 12/144,380

(22) Filed: Jun. 23, 2008

(65) Prior Publication Data
US 2009/0021151 A1    Jan. 22, 2009

(30) Foreign Application Priority Data
Jul. 19, 2007   (JP)   ............... 2007-187820

(51) Int. Cl.
H01J 1/62   (2006.01)
(52) U.S. Cl. ................. 313/504; 313/506
(58) Field of Classification Search ........ 313/498, 313/504, 506
See application file for complete search history.

(56) References Cited

U.S. PATENT DOCUMENTS 6,541,130 B2   4/2003   Fukuda

2007/0257609 A1   11/2007   Fukuda et al.
2008/0067926 A1   3/2008   Mizuno et al.
2008/0185954 A1   8/2008   Fukuda et al.

OTHER PUBLICATIONS

Peng et al., "High-Efficiency Microactivity Top-Emitting Organic Light-Emitting Diodes Using Silver Anode," Applied Physics Letters, 88:073517-1 (Feb. 2006).
Lu et al., High-Efficiency Microactivity Top-Emitting Organic Light-Emitting Diodes Using Silver Anode, Applied Physics Letters, 81:3921 (Nov. 2002).

*Primary Examiner*—Vip Patel
(74) *Attorney, Agent, or Firm*—Fitzpatrick, Cella, Harper & Scinto

(57) ABSTRACT

Provided is a display apparatus, in which: among a red light emitting device, a green light emitting device, and a blue light emitting device, one or two of the organic light emitting devices include a metal translucent layer on a side closer to a second electrode with respect to a emission layer and a second reflection surface includes a surface of the metal translucent layer on a side of the emission layer; and the rest of the organic light emitting devices include a low-refractive index layer having a lower refractive index than the second electrode on the side closer to the second electrode with respect to the emission layer and the second reflection surface includes a surface of the low-refractive index layer on the side of the emission layer.

7 Claims, 2 Drawing Sheets

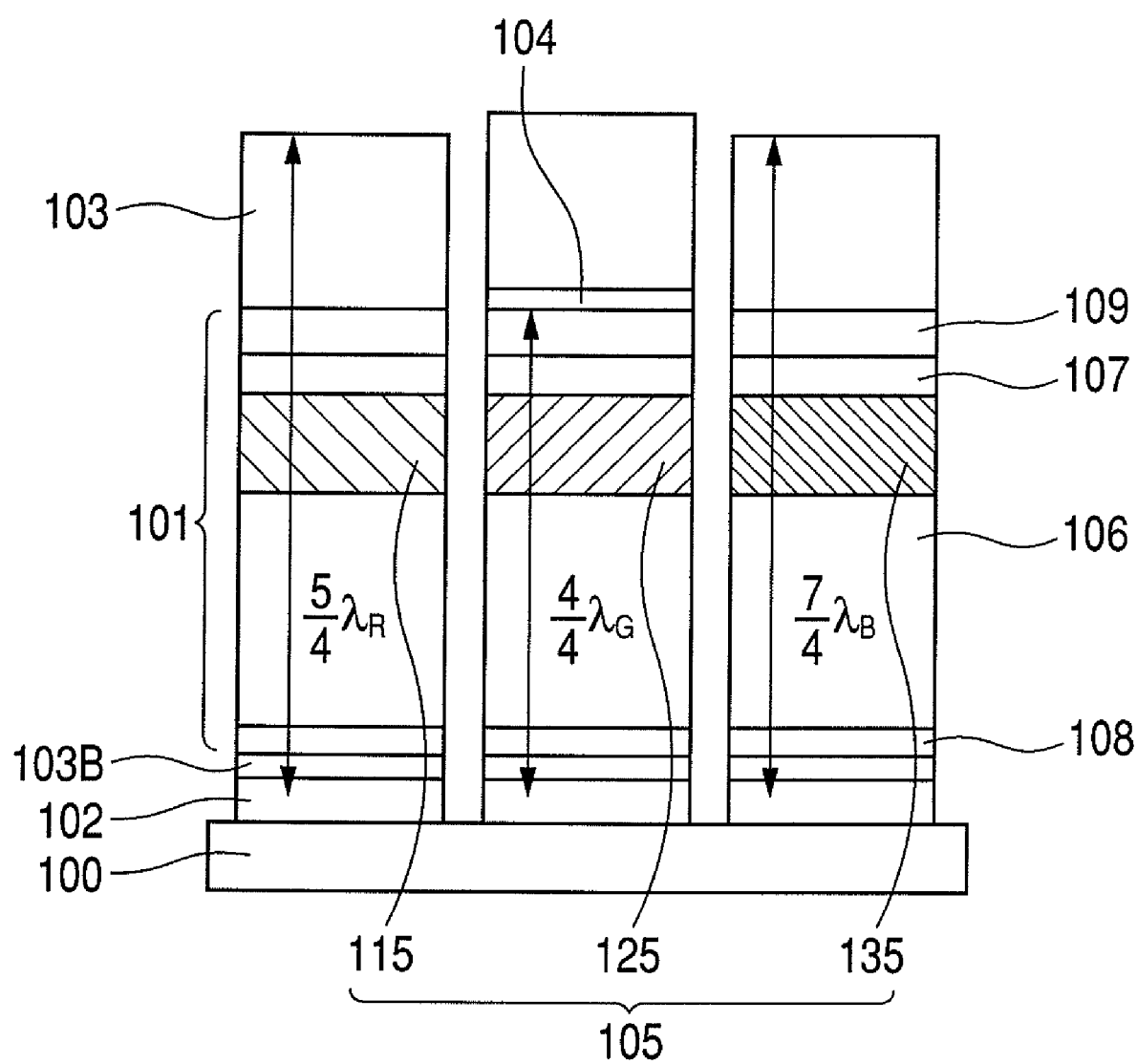

DISPLAY APPARATUS

BACKGROUND OF THE INVENTION

1. Field of the Invention

The present invention relates to a display apparatus.

2. Description of the Related Art

An organic electroluminescent(EL) display apparatus is a new type of flat panel display and formed from an array of organic light-emitting diode(OLED) devices. In general, an OLED device is comprised of an electrode serving as the anode, an electrode serving as the cathode and several thin organic layers sandwiched between these two electrodes. The organic layers include at least one emission layer containing more than one fluorescent or phosphorescent organic compound to emit light at each emission color. Applying voltage to the OLED device, holes and electrons are injected from the anode and the cathode, respectively, and form excitons in the emission layer. Then these excitons recombine and release their energy as emission of light.

In such an OLED device, it is proposed that emission efficiency be enhanced or chromaticity be adjusted using interference effects of light. For example, U.S. Pat. No. 6,541, 130 proposes that a film thickness of an organic layer formed between an emission layer and a reflective electrode be adjusted to increase interference.

Also in Appl. Phys. Lett., Vol. 81, p. 3921 (2002), for example, a cavity structure, which is consisted of two reflection surface, is proposed to enhance light emission or adjust light emission chromaticity. One reflection surface is a reflective electrode and the other is an interface between a transparent electrode located on the side from which light is extracted and air.

Further, in Appl. Phys. Lett., Vol. 88, p. 073517 (2006) or the like, a cavity structure is proposed to enhance light emission or adjust light emission chromaticity between a metal translucent electrode located on the side from which light is extracted and a reflective electrode.

However, in the aforementioned technologies, the film thickness of an organic layer, a thickness of the transparent electrode or the like needs to be changed for each emission color, which leads to a problem in that a manufacturing process of the display apparatus becomes more complicated.

SUMMARY OF THE INVENTION

In view of the above-mentioned problem, it is an object of the present invention to provide a display apparatus having high efficiency and excellent color purity with a simple structure.

In order to solve the above problem, the display apparatus according to the present invention includes a plurality of OLED devices including a red light emitting device, a green light emitting device, and a blue light emitting device, each of the OLED devices having an organic layer including an emission layer formed between a first electrode and a second electrode from which light is extracted, the each of the OLED devices having a cavity structure in which light emitted in the emission layer is resonated between a first reflection surface provided on a side closer to the first electrode with respect to the emission layer and a second reflection surface provided on a side closer to the second electrode with respect to the emission layer, in which: one or two of the OLED devices having three colors include a metal translucent layer on the side closer to the second electrode with respect to the emission layer, and the second reflection surface includes a surface of the metal translucent layer on a side of the emission layer; and the rest of the OLED devices include a low-refractive index layer having a lower refractive index than the second electrode on the side closer to the second electrode with respect to the emission layer, and the second reflection surface includes a surface of the low-refractive index layer on the side of the emission layer.

According to the present invention, the display apparatus having high efficiency and excellent color purity can be realized with a simple structure.

Further features of the present invention will become apparent from the following description of exemplary embodiment with reference to the attached drawings.

BRIEF DESCRIPTION OF THE DRAWINGS

FIG. 3 is a schematic view (schematic cross-sectional view 2) of the organic electroluminescent display apparatus according to the present invention.

DESCRIPTION OF THE EMBODIMENT

Hereinafter, the principle of the present invention is described according to configuration examples.

Figure 1:
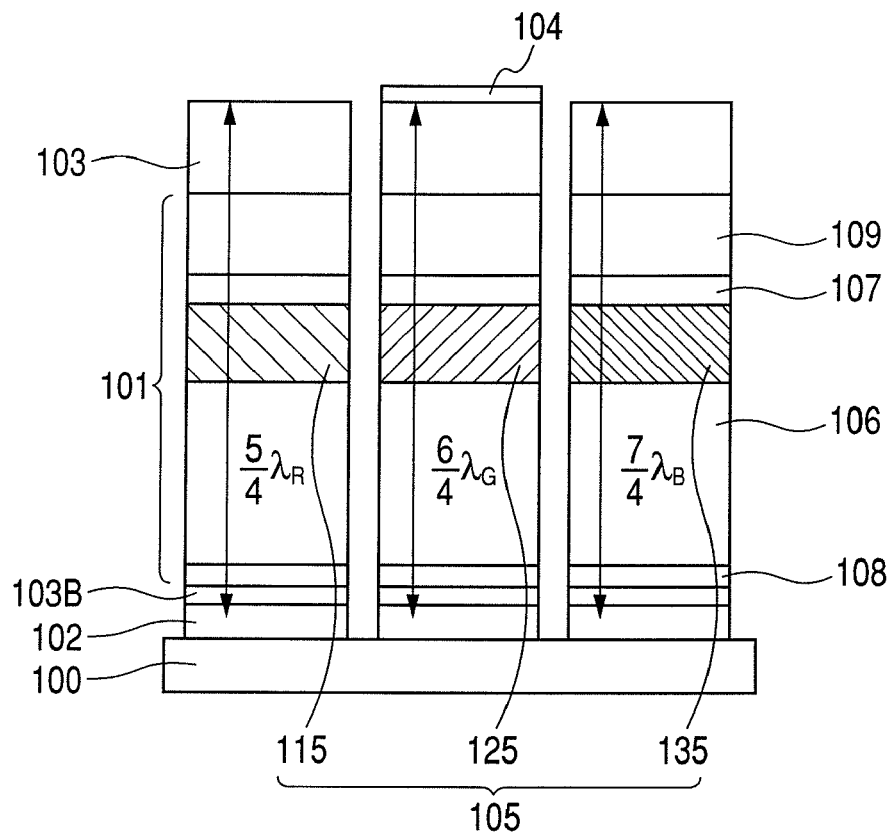
FIG. 1 is a schematic view (schematic cross-sectional view 1) of an organic electroluminescent display apparatus according to the present invention.

FIG. 1 illustrates a schematic cross-sectional view of a full-color display apparatus according to the present invention. In other words, the display apparatus according to this embodiment has a plurality of pixels, and each of the pixels has sub-pixels of a plurality of colors (red (R), green (G), and blue (B)). An organic EL display apparatus is illustrated as an example in FIG. 1, but an inorganic EL display apparatus or a quantum-dot light emitting diode (QD-LED) display apparatus can also be employed.

In each of a red OLED device, a green OLED device, and a blue OLED device which compose the organic EL display apparatus illustrated in FIG. 1, a reflective electrode (first electrode) 102 and a transparent electrode 103B formed on the reflective electrode 102 are stacked on a substrate 100 to form an anode. On the anode thus formed, an organic layer 101 including a fluorescent organic compound or a phosphorescent organic compound is stacked to form a transparent electrode (second electrode) 103 serving as a cathode. Further, only in an G OLED device, a metal translucent electrode (metal translucent layer) 104 is formed on the transparent electrode 103.

In the organic layer 101, as illustrated in FIG. 1, a hole transport layer 106, a emission layer 105 (R emission layer 115, G emission layer 125, and B emission layer 135), and an electron transport layer 107 are generally stacked. The emission layer 105 includes a fluorescent organic compound or a phosphorescent organic compound according to each emission color. Further, if necessary, a hole injection layer 108 and an electron injection layer 109 may be sandwiched between the anode and the hole transport layer 106 and between the cathode and the electron transport layer 107, respectively.

When voltage is applied to those OLED devices, a hole and an electron are injected to the organic layer 101 from the anode and the cathode, respectively. The injected hole and electron form excitons in the emission layer 105, and light (spontaneous emission light) is emitted when the excitons recombine with each other. In the configuration example of the OLED device illustrated in FIG. 1, a transparent electrode 103 side (second electrode side) becomes a side from which light is extracted with respect to the emission layer 105.

In the respective R, G, and B OLED devices, an optical cavity structure is formed between a first reflection surface and a second reflection surface. In the configuration example illustrated in FIG. 1, the first reflection surface is formed on a side closer to the first electrode with respect to the emission layer 105, which is an interface between the reflective electrode 102 and the transparent electrode 103B on the transparent electrode 102. The first electrode is common in the R, G, and B OLED devices. On the other hand, the second reflection surface, formed on a side closer to the second electrode with respect to the emission layer 105, differs between the R and B OLED devices and the G OLED device. In the R and B OLED devices, the second reflection surface is an emission layer side surface of a low-refractive index layer (air), having a lower refractive index than the second electrode (the transparent electrode 103), on the light extraction side with respect to the second electrode and an optical free end. In the G OLED device, the second reflection surface is an emission layer side surface of the metal translucent layer and an optical fixed end. Accordingly, the present invention is characterized in that the second reflection surface of the free end, the second reflection surface of the fixed end, and the second reflective surface of the free end are formed in series in the descending order of an peak emission wavelength of the R, G, and B OLED devices.

Figure 2:
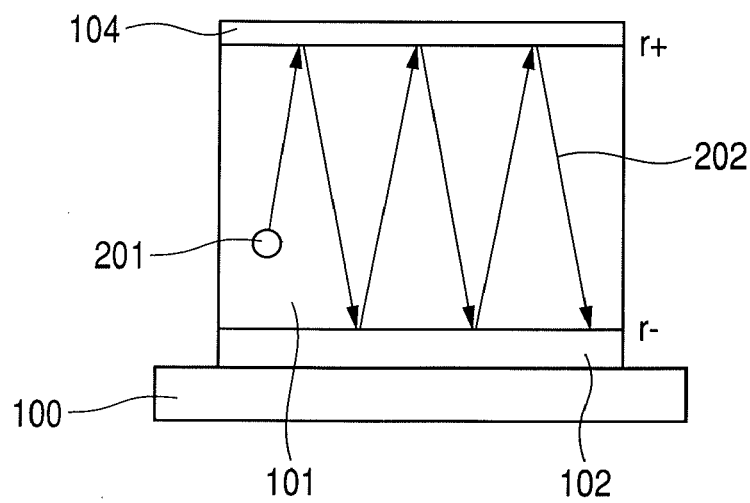
FIG. 2 is a schematic view of multiple interference of light in an optical cavity.

In the optical cavity, emission characteristics of spontaneous emission light are changed due to multiple interference effects. The concept of the multiple interference is illustrated in FIG. 2. Light emitted from an emission point 201 is reflected between the first reflection surface and the second reflection surface a plurality of times, which causes multiple interference between a large amount of reflected light in the opticalcavity. In order to increase a specific emission wavelength with the use of the multiple interference of the optical cavity, it is essential to adjust an optical path length (refractive index×film thickness) between the first reflection surface and the second reflection surface. Incidentally, in FIG. 2, reference numeral 202 denotes multiple reflected light.

Now, it is assumed that the emission wavelength and a wave number of the OLED device are $\lambda$ and $k=2\Pi/\lambda$, respectively. The emission intensity $I(\lambda)$ to the side from which light is extracted (second reflection surface side) is proportional to the right side of Formula I in a direction perpendicular to the substrate, provided that a complex reflection coefficient of the second reflection surface is $r_+=|r_+|\exp i\phi_+$, a complex reflection coefficient of the first reflection surface is $r_-=|r_-|\exp i\phi_-$, an optical path length (optical distance) between the first reflection surface and the second reflection surface is L, and an optical path length from the light emitting point 201 to the first reflection surface is $L_-$. The numerator of the right side of Formula I represents the effects of wide-angle interference and the denominator of the right side of Formula I represents the effects of the multiple interference. Phase $\phi_-$ and $\phi_+$ of the complex reflection coefficient represent phase shifts of respective reflection surfaces. In this case, a domain of the phase shift is assumed as follows: $-\Pi < \phi_- \leq \Pi$, $-\Pi < \phi_+ \leq \Pi$.

$$I(\lambda) \propto \left|\frac{1+r_-\exp[i2kL_-]}{1-r_+r_-\exp[i2kL]}\right|^2 \quad \text{(Formula I)}$$

From the phase part of the denominator of Formula I, an interference condition for increasing multiple interference is given by Formula II, provided that a positive integer m is equal to or more than 0. In this case, a sum of the phase shifts on the reflection surface is assumed that $\phi=\phi_-+\phi_+$. Thus, in order to improve light-extraction efficiency with respect to emission wavelength $\lambda$, the optical path length L may be adjusted to satisfy Formula II. A range where multiple interference is increased is $m\pm 0.25$.

$$\frac{2L}{\lambda} + \frac{\phi}{2\pi} = m \quad \text{(Formula II)}$$

For the R, G, and B OLED devices, it is assumed that peak emission wavelengths are $\lambda_R$, $\lambda_G$, and $\lambda_B$, optical path lengths between the first reflection surface and the second reflection surface are $L_R$, $L_G$, and $L_B$, and phase shifts on the reflection surface are $\phi_R$, $\phi_G$, and $\phi_B$, respectively. From Formula II, the optical path lengths $L_R$, $L_G$, and $L_B$ between the first reflection surface and the second reflection surface are set to satisfy Formula III using positive integers $m_R$, $m_G$, and $m_B$. The positive integers $m_R$, $m_G$, and $m_B$ are desirably equal to or less than three so as not to generate a large chromatic variation due to viewing angle change.

$$\frac{2L_R}{\lambda_R} + \frac{\phi_R}{2\pi} = m_R \quad \text{(Formula III)}$$

$$\frac{2L_G}{\lambda_G} + \frac{\phi_G}{2\pi} = m_G$$

$$\frac{2L_B}{\lambda_B} + \frac{\phi_B}{2\pi} = m_B$$

At a fixed end such as a metal reflection surface or a reflection surface changing from a low-refractive index to a high-refractive index, a phase shift is about $-\Pi$. On the other hand, at a free end such as a reflection surface changing from a high-refractive index to a low-refractive index, a phase shift is about 0. In the examples of this embodiment, provided that phase shifts of the R, G, and B OLED devices are $\phi_R$, $\phi_G$, and $\phi_B$, their ranges are $\phi_R$ to $-\Pi$, $\phi_G$ to $-2\Pi$, and $\phi_B$ to $-\Pi$, respectively. Here, when positive integers are selected as $m_R=m_G=2$ and $m_B=3$, Formula III becomes a condition for an optical path length of Formula IV.

$$L_R \sim \frac{5}{4}\lambda_R \quad \text{(Formula IV)}$$

$$L_G \sim \frac{6}{4}\lambda_G$$

$$L_B \sim \frac{7}{4}\lambda_B$$

An peak emission wavelength $\lambda_R$ of R is about from 600 nm to 640 nm, an peak emission wavelength $\lambda_G$ of G is about from 505 nm to 545 nm, and an peak emission wavelength $\lambda_B$ of B is about from 440 nm to 480 nm. From the above, there is found a proportional relationship of $\lambda_R:\lambda_G:\lambda_B=7:6:5$, or $\lambda_R:\lambda_G:\lambda_B=6:5:4$, roughly. Thus, combined with the conditions of Formula IV, respective optical path lengths of the R, G, and B OLED devices, which increase interference, can be set roughly to the same level in the order of $L_R$, $L_G$, and $L_B$. Accordingly, in the R, G, and B OLED devices, conditions for increasing interference of the optical cavity can be satisfied with a simple device structure in which respective layers other than the emission layer formed between the first reflection surface and the second reflection surface are common. Note that the above-mentioned respective layers other than the emission layer include a hole injection layer, a hole transport layer, an electron transport layer, an electron injection layer, a transparent electrode on a reflective electrode, a transparent electrode, and a charge generating layer, and may further include a carrier transport layer and a charge injection layer.

Thus, according to the present invention, a display apparatus having high efficiency and excellent color purity can be realized with a simple structure.

In this embodiment, the second reflection surfaces have a free end in R, a fixed end in G, and a free end in B in the descending order of an emission wavelength of the R, G, and B OLED devices. Here, as illustrated in FIG. 3, the metal translucent electrode 104 of the G OLED device may be formed between the transparent electrode 103 and the organic layer 101. In such a case, if a positive integer is selected as $m_R=2, m_G=1$, and $m_B=3$, Formula III becomes a condition for an optical path length of Formula V. Also in this case, the optical path length of the transparent electrode 103 is adjusted, with the result that, in the R, G, and B OLED devices, a condition for increasing interference of an optical cavity can be satisfied with a simple device structure in which respective layers other than the emission layer sandwiched between the first reflection surface and the second reflection surface are common to R, G, and B OLED devices. In other words, a display apparatus having high efficiency and excellent color purity can be realized with a simple structure.

$$L_R \sim \frac{5}{4}\lambda_R$$ (Formula V)

$$L_G \sim \frac{4}{4}\lambda_G$$

$$L_B \sim \frac{7}{4}\lambda_B$$

Further, the metal translucent electrode 104 may be formed in the R and B OLED devices instead of in the G OLED device. In other words, the second reflection surfaces may have a fixed end in R, a free end in G, and a fixed end in B in the descending order of an emission wavelength of the R, G, and B OLED devices.

Hitherto, a description has been made with the structure where a substrate side is an anode and a side from which light is extracted is a cathode. However, the present invention can also be carried out with a structure where the substrate side is a cathode, the side from which light is extracted is an anode, and a hole transport layer, a emission layer, and an electron transport layer are stacked in a reverse order Therefore, the display apparatus according to the present invention is not limited to the structure where the substrate side is an anode and the side from which light is extracted is a cathode.

Further, organic compounds used in the hole transport layer 106, the emission layer 105, the electron transport layer 107, the hole injection layer 108, and the electron injection layer 109 of FIG. 1 include a low-molecular-weight material, a high-molecular-weight material, or both of them, and are not particularly limited. Inorganic materials may further be used if necessary.

Incidentally, the organic layers except for the emission layers can be formed to straddle the R, G, and B OLED devices in series, considering easiness in forming the respective layers.

The organic EL display apparatus according to this embodiment has a top emission structure, but can have a bottom emission structure where the substrate side becomes the side from which light is extracted.

Hereinafter, a more detailed description is made.

Examples of the present invention are described in the following, but the present invention is not limited thereto.

EXAMPLE 1

A full-color organic EL display apparatus of the structure illustrated in FIG. 1 is manufactured by the method described below. In other words, the display apparatus according to Example 1 is an organic EL display apparatus in which the pixels are formed of sub-pixels of a plurality of colors (red (R), green (G), and blue (B)), and the second reflection surfaces have a free end in the R OLED device, a fixed end in the G OLED device, and a free end in the B OLED device in series.

First, on a glass substrate serving as a support member, a TFT driving circuit made of a low-temperature polysilicon is formed, and a planarization film made of an acrylic resin is formed thereon to form the substrate 100. On the substrate 100, an Al alloy is formed with a film thickness of about 150 nm as the reflective electrode 102 by sputtering. The reflective electrode 102 made of an Al alloy is a high-reflectivity electrode having a spectral reflectivity equal to or more than 75% at a wavelength band of visible light ($\lambda$=380 nm to 780 nm). An Ag alloy may be used in place of an Al alloy. On the reflective electrode 102, as the transparent electrode 103 B on the reflective electrode 102, indium zinc oxide (IZO) is formed with a film thickness of 20 nm by sputtering and an electrode patterning is performed to form an anode.

Further, a device isolation film of SiNxOy is formed with a film thickness of 320 nm, and then an opening portion serving as electroluminescence (EL) emitting region is etched in each of the sub-pixels to form an anode substrate.

The anode substrate is subjected to ultrasonic cleaning with an isopropyl alcohol (IPA), and then dried after cleaned by boiling. After that, the anode substrate is subjected to UV/ozone cleaning, and the respective organic layers 101 of R, G, and B are formed by the vacuum vapor deposition method.

First, Compound (I) represented by the following structural formula is formed with a film thickness of 200 nm as the hole transport layer 106 common to R, G, and B. A degree of vacuum in this case is $1\times10^{-4}$ Pa, and a deposition rate is 0.2 nm/sec.

Compound (I)

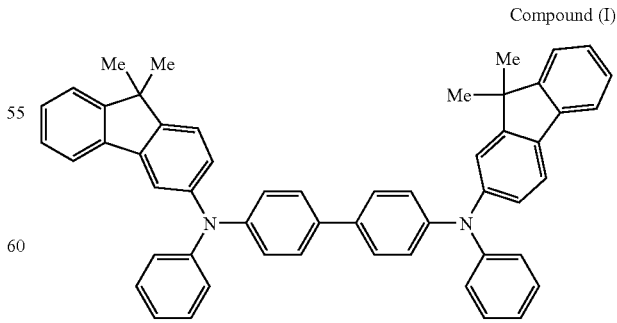

Subsequently, using a shadow mask, the emission layer for each of R, G, and B is formed. As the R emission layer 115, CBP as a host and phosphorescent compound Btp2Ir (acac)

are co-deposited to form a emission layer with a film thickness of 65 nm As the G emission layer 125, Alq3 as a host and luminescent compound Coumarin 6 are co-deposited to form a emission layer with a film thickness of 20 nm. As the B emission layer 135, the following Compound (II) as a host and luminescent Compound (III) are co-deposited to form a emission layer with a film thickness of 80 nm. A degree of vacuum during the deposition is $1\times10^{-4}$ Pa, and a film formation rate is 0.2 nm/sec.

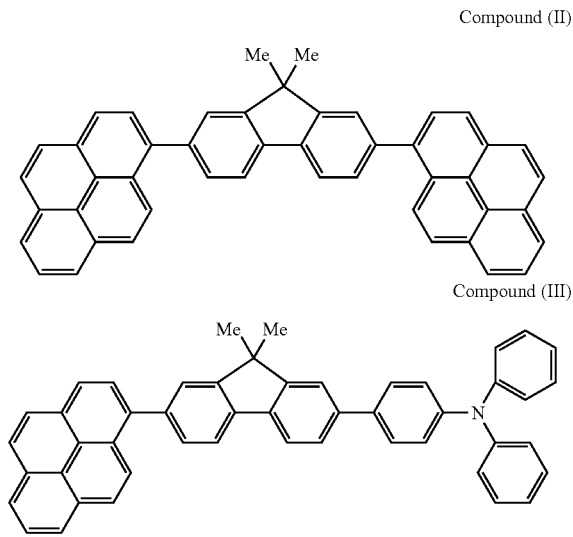

Compound (II)

Compound (III)

Further, as the electron transport layer 107 common to R, G, and B, bathophenanthroline (Bphen) is formed with a film thickness of 10 nm by the vacuum vapor deposition method. A degree of vacuum during the deposition is $1\times10^{-4}$ Pa, and a film formation rate is 0.2 nm/sec. Next, as the electron injection layer 109 common to R, G, and B, Bphen and $Cs_2CO_3$ are co-deposited (ratio by weight=90:10) to form an electron injection layer with a film thickness of 60 nm. A degree of vacuum during the codeposition is $3\times10^{-4}$ Pa, and a film formation rate is 0.2 nm/sec.

The substrate formed until the formation of the electron injection layer 109 is made as the transparent electrode 103, and IZO is formed with a film thickness of 55 nm by sputtering.

Further, using a shadow mask, Ag is formed with a film thickness of 10 nm as the metal translucent electrode 104 on the transparent electrode 103 of G.

Further, a desiccant is arranged in the vicinity of the display apparatus and sealed with an etched cap glass, whereby the organic EL display apparatus is obtained.

In Example 1 of the present invention, the second reflection surface of the free end, the second reflection surface of the fixed end, and the second reflection surface of the free end are formed in series in the descending order of an peak emission wavelength of the R, G, and B OLED devices. Formula VI represents values obtained by calculating a sum of the left sides of Formula III for R, G, and B, which are optical path lengths corresponding to the positive integers, $m_R=2$, $m_G=2$, and $m_B=3$ In R, G, and B, obtained are optical path lengths within a range of $m_R+0.25$, $m_G+0.25$, and $m_B+0.25$, respectively, which fall within the range where multiple interference is increased. Further, the organic layer other than the emission layer is common in structure to R, G, and B.

$$\frac{2L_R}{\lambda_R} + \frac{\phi_R}{2\pi} = 2.03 \cong 2 = m_R \quad \text{(Formula VI)}$$

$$\frac{2L_G}{\lambda_G} + \frac{\phi_G}{2\pi} = 1.97 \cong 2 = m_G$$

$$\frac{2L_B}{\lambda_B} + \frac{\phi_B}{2\pi} = 3.16 \cong 3 = m_B$$

EXAMPLE 2

A full-color organic EL display apparatus of a structure illustrated in FIG. 3 is manufactured by the method described below, which is manufactured in the same manner as Example 1 until the formation of the hole transport layer 106.

Next, the respective emission layers for R, G, and B are formed using a shadow mask. As the R emission layer 115, CBP as a host and phosphorescent compound Btp2Ir (acac) are co-deposited to form a emission layer with a film thickness of 70 nm. As the G emission layer 125, Alq3 as a host and luminescent compound Coumarin 6 are co-deposited to form a emission layer with a film thickness of 15 nm. As the B emission layer 135, Compound (II) as a host and luminescent Compound (III) are co-deposited to form a emission layer with a film thickness of 85 nm. A degree of vacuum during the deposition is $1\times10^{-4}$ Pa, and a film formation rate is 0.2 nm/sec. Further, as the electron transport layer 107 common to R, G, and B. bathophenanthroline (Bphen) is formed with a film thickness of 10 nm by the vacuum vapor deposition method. A degree of vacuum during the deposition is $1\times10^{-4}$ Pa, and a film formation rate is 0.2 nm/sec. Next, as the electron injection layer 109 common to R, G, and B, Bphen and $Cs_2CO_3$ are co-deposited (ratio by weight=90:10) to form an electron injection layer with a film thickness of 15 nm. A degree of vacuum during the codeposition is $3\times10^{-4}$ Pa, and a film formation rate is 0.2 nm/sec.

In Example 2 of the present invention, only on the electron injection layer 109 of G, using a shadow mask, Ag is formed with a film thickness of 20 nm as the metal translucent electrode 104.

Further, as the transparent electrode 103 common to R, G, and B, IZO is formed with a film thickness of 85 nm by sputtering.

Finally, a desiccant is arranged in the vicinity of the display apparatus and sealed with an etched cap glass, whereby the organic EL display apparatus is obtained.

In Example 2 of the present invention, the second reflection surface of the free end, the second reflection surface of the fixed end, and the second reflection surface of the free end are formed in series in the descending order of an peak emission wavelength of the R, G, and B OLED devices. Formula VII represents values obtained by calculating a sum of the left sides of Formula III for R, G, and B, which are optical path lengths corresponding to the positive integers, $m_R=2$, $m_G=1$, and $m_B=3$. In R, G, and B, obtained are optical path lengths corresponding to $m_R\pm0.25$, $m_G+0.25$, and $m_B+0.25$, respectively, which fall within the range where multiple interference is increased. Further, the organic layers other than the emission layer is common in structure to R, G, and B.

$$\frac{2L_R}{\lambda_R} + \frac{\phi_R}{2\pi} = 2.01 \cong 2 = m_R \quad \text{(Formula VII)}$$

-continued $$\frac{2L_G}{\lambda_G} + \frac{\phi_G}{2\pi} = 1.02 \cong 1 = m_G$$

$$\frac{2L_B}{\lambda_B} + \frac{\phi_B}{2\pi} = 3.13 \cong 3 = m_B$$

COMPARATIVE EXAMPLE 1

Comparative Example 1 is the same as Example 1 except for that the metal translucent electrode 104 is not formed in the G sub-pixel. In other words, all the second reflection surfaces have a free end in R, G, and B.

COMPARATIVE EXAMPLE 2

Comparative Example 2 is the same as Example 2 except for that the metal translucent electrode 104 is not formed in the G sub-pixel. In other words, all the second reflection surfaces have a free end in R, G, and B.

COMPARATIVE EXAMPLE 3

Comparative Example 3 describes the case where the organic layer other than the emission layer is color-coded for R, G, and B, Comparative Example 3 is the same as Example 1 until the formation of the hole transport layer.

Compound (I) is formed in each sub-pixel, using a shadow mask, with a film thickness of 235 nm as an R hole transport layer, with a film thickness of 170 nm as a G hole transport layer, and with a film thickness of 120 nm as a B hole transport layer. A degree of vacuum in this case is $1 \times 10^{-4}$ Pa, and a vapor deposition rate is 0.2 nm/sec.

Next, the respective emission layers for R, G, and B are formed using a shadow mask. As the R emission layer, CBP as a host and phosphorescent compound Btp2Ir (acac) are co-deposited to form a emission layer with a film thickness of 30 nm. As the G emission layer, Alq3 as a host and luminescent compound Coumarin 6 are co-deposited to form a emission layer with a film thickness of 40 nm. As the B emission layer, Compound (II) as a host and luminescent Compound (III) are co-deposited to form a emission layer with a film thickness of 35 nm. A degree of vacuum during the deposition is $1 \times 10^{-4}$ Pa, and a film formation rate is 0.2 nm/sec. Further, as the electron transport layer common to R, G, and B, bathophenanthroline (Bphen) is formed with a film thickness of 10 nm by the vacuum vapor deposition method. A degree of vacuum during the deposition is $1 \times 10^{-4}$ Pa, and a film formation rate is 0.2 nm/sec. Next, as the electron injection layer common to R, G, and B, Bphen and $Cs_2CO_3$ are co-deposited (ratio by weight=90:10) to form an electron injection layer with a film thickness of 20 nm. A degree of vacuum during the codeposition is $3 \times 10^{-4}$ Pa, and a film formation rate is 0.2 nm/sec.

Further, as the transparent electrodes 103 common to R, G, and B, IZO is formed with a film thickness of 80 nm by sputtering.

Finally, a desiccant is arranged in the vicinity of the display apparatus and sealed with an etched cap glass, whereby the OLED device is obtained.

In other words, Comparative Example 3 is a configuration example in which all the second reflection surfaces have a free end in R, G, and B, and the organic layer (hole transport layer in Comparative Example 3) other than the emission layer is color-coded for R, G, and B, whereby the resonance conditions are satisfied.

Table 1 illustrates emission efficiency (cd/A), CIE chromaticity (x and y), power consumption ratio, and Gamut evaluated value of the R, G, and B sub-pixels in Example 1, Example 2, Comparative Example 1, Comparative Example 2, and Comparative Example 3. The power consumption ratio is based on a power consumption ratio of Comparative Example 3. In both Comparative Example 1 and Comparative Example 2, compared with Comparative Example 3, performance of Gamut decreases along with the simplification of the structure. Meanwhile, in Example 1 and Example 2, the same performance such as the power consumption ratio and Gamut as in the case of Comparative Example 3 can be realized with a simpler structure compared with Comparative Example 3.

TABLE 1

| | | R | G | B | Power consumption ratio | Gamut |
|---|---|---|---|---|---|---|
| Example 1 | Efficiency [cd/A] | 15.3 | 21.1 | 3.2 | 1.03 | 100% |
| | Chromaticity (x,y) | (0.68, 0.32) | (0.23, 0.71) | (0.14, 0.08) | | |
| Comparative Example 1 | Efficiency [cd/A] | 15.3 | 21.1 | 3.2 | 0.97 | 78% |
| | Chromaticity (x,y) | (0.68, 0.32) | (0.35, 0.63) | (0.14, 0.08) | | |
| Example 2 | Efficiency [cd/A] | 15.5 | 27.6 | 3.1 | 0.95 | 97% |
| | Chromaticity (x,y) | (0.67, 0.33) | (0.26, 0.72) | (0.15, 0.08) | | |
| Comparative Example 2 | Efficiency [cd/A] | 15.5 | 25.6 | 3.1 | 0.97 | 91% |
| | Chromaticity (x,y) | (0.67, 0.33) | (0.27, 0.69) | (0.15, 0.08) | | |
| Comparative Example 3 | Efficiency [cd/A] | 13.7 | 27.9 | 2.6 | 1.00 | 100% |
| | Chromaticity (x,y) | (0.67, 0.33) | (0.23, 0.70) | (0.14, 0.06) | | |

While the present invention has been described with reference to the embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2007-187820, filed Jul. 19, 2007, which is hereby incorporated by reference herein in its entirety.

What is claimed is:

1. A display apparatus, comprising a plurality of organic light emitting devices including a red light emitting device, a green light emitting device, and a blue light emitting device,
    each of the organic light emitting devices having an organic layer including a emission layer formed between a first electrode and a second electrode from which light is extracted,
    the each of the plurality of organic light emitting devices having a cavity structure in which light emitted in the emission layer is resonated between a first reflection surface provided on a side closer to the first electrode with respect to the emission layer and a second reflection surface provided on a side closer to the second electrode with respect to the emission layer,
    wherein:
    one or two of the organic light emitting devices having three colors include a metal translucent layer on the side closer to the second electrode with respect to the emission layer, and the second reflection surface includes a surface of the metal translucent layer on a side of the emission layer; and the rest of the organic light emitting devices include a low-refractive index layer having a lower refractive index than the second electrode on the side closer to the second electrode with respect to the emission layer, and the second reflection surface includes a surface of the low-refractive index layer on the side of the emission layer.

2. The display apparatus according to claim 1, wherein:

the second reflection surface of the green light emitting device comprises a surface of the metal translucent layer on the side of the emission layer; and the second reflection surface of the red light emitting device and the second reflection surface of the blue light emitting device each comprise the surface of the low-refractive index layer on the side of the emission layer.

3. The display apparatus according to claim 1, wherein, when a peak emission wavelength of the red light emitting device, a peak emission wavelength of the green light emitting device, and a peak emission wavelength of the blue light emitting device are $\lambda_R$, $\lambda_G$, and $\lambda_B$, respectively, and an optical path length between the first reflection surface and the second reflection surface of the red light emitting device, an optical path length between the first reflection surface and the second reflection surface of the green light emitting device, and an optical path length between the first reflection surface and the second reflection surface of the blue light emitting device are $L_R$, $L_G$, and $L_B$, respectively, Formula I below is satisfied:

$$1.75 < \frac{2L_R}{\lambda_R} + \frac{\phi_R}{2\pi} < 2.25 \quad \text{(Formula I)}$$

$$1.75 < \frac{2L_G}{\lambda_G} + \frac{\phi_G}{2\pi} < 2.25$$

$$2.75 < \frac{2L_B}{\lambda_B} + \frac{\phi_B}{2\pi} < 3.25$$

wherein $\phi_R$, $\phi_G$, and $\phi_B$ represent a sum of a phase shift of the first reflection surface and a phase shift of the second reflection surface of the red light emitting device, a sum of a phase shift of the first reflection surface and a phase shift of the second reflection surface of the green light emitting device, and a sum of a phase shift of the first reflection surface and a phase shift of the second reflection surface of the blue light emitting device, respectively.

4. The display apparatus according to claim 1, wherein, when a peak emission wavelength of the red light emitting device, a peak emission wavelength of the green light emitting device, and a peak emission wavelength of the blue light emitting device are $\lambda_R$, $\lambda_G$, and $\lambda_B$, respectively, and an optical path length between the first reflection surface and the second reflection surface of the red light emitting device, an optical path length between the first reflection surface and the second reflection surface of the green light emitting device, and an optical path length between the first reflection surface and the second reflection surface of the blue light emitting device are $L_R$, $L_G$, and $L_B$, respectively, Formula II below is satisfied:

$$1.75 < \frac{2L_R}{\lambda_R} + \frac{\phi_R}{2\pi} < 2.25 \quad \text{(Formula II)}$$

$$0.75 < \frac{2L_G}{\lambda_G} + \frac{\phi_G}{2\pi} < 1.25$$

$$2.75 < \frac{2L_B}{\lambda_B} + \frac{\phi_B}{2\pi} < 3.25$$

wherein $\phi_R$, $\phi_G$, and $\phi_B$ represent a sum of a phase shift of the first reflection surface and a phase shift of the second reflection surface of the red light emitting device, a sum of a phase shift of the first reflection surface and a phase shift of the second reflection surface of the green light emitting device, and a sum of a phase shift of the first reflection surface and a phase shift of the second reflection surface of the blue light emitting device, respectively.

5. The display apparatus according to claim 1, wherein the organic layer other than the emission layer is formed in series so as to straddle the plurality of organic light emitting devices.

6. The display apparatus according to claim 1, wherein the organic layer comprises a carrier transport layer.

7. The display apparatus according to claim 1, wherein the organic layer comprises a charge injection layer.

* * * * *